(12) United States Patent
Sung et al.

(10) Patent No.: US 7,646,212 B2
(45) Date of Patent: Jan. 12, 2010

(54) MEMORY SYSTEM INCLUDING A POWER DIVIDER ON A MULTI MODULE MEMORY BUS

(75) Inventors: Myung-Hee Sung, Gyeonggi-do (KR); Jin-Gook Kim, Daejeon (KR); Joung-Ho Kim, Daejeon (KR); Jong-Hoon Kim, Gyeonggi-do (KR)

(73) Assignees: Samsung Electronic Co., Ltd., Gyeonggi-do (KR); Korea Advanced Institute of Science and Technology (KAIST), Daejeon (KR)

( * ) Notice: Subject to any disclaimer, the term of this patent is extended or adjusted under 35 U.S.C. 154(b) by 416 days.

(21) Appl. No.: 11/668,397

(22) Filed: Jan. 29, 2007

(65) Prior Publication Data
US 2007/0194968 A1    Aug. 23, 2007

(30) Foreign Application Priority Data
Feb. 3, 2006    (KR) ............................... 2006-10384

(51) Int. Cl.
*H03K 19/003* (2006.01)
(52) U.S. Cl. .......................................... 326/30; 326/31
(58) Field of Classification Search .................. 326/30, 326/21, 31
See application file for complete search history.

(56) References Cited

U.S. PATENT DOCUMENTS

| | | | | |
|---|---|---|---|---|
| 4,367,445 A | * | 1/1983 | Dydyk | 333/127 |
| 4,875,024 A | * | 10/1989 | Roberts | 333/127 |
| 4,988,962 A | | 1/1991 | Janer | |
| 6,125,419 A | * | 9/2000 | Umemura et al. | 710/110 |
| 6,300,789 B1 | | 10/2001 | Ball | |
| 7,049,907 B2 | * | 5/2006 | Gurvich et al. | 333/156 |

FOREIGN PATENT DOCUMENTS

| | | |
|---|---|---|
| JP | 2002-33775 | 1/2002 |
| KR | 2001-0037266 | 5/2001 |
| KR | 2003-0069140 | 8/2003 |

* cited by examiner

*Primary Examiner*—James Cho
(74) *Attorney, Agent, or Firm*—Harness, Dickey & Pierce, P.L.C.

(57) ABSTRACT

A memory system includes a memory controller, a transmission bus, a power divider, a first memory chip, and a second memory chip. The transmission bus is coupled from the memory controller to a first node of the power divider for transferring signals. The first node of the power divider is coupled to a second node of the power divider via a first line, and the first node is also coupled to a third node of the power divider via a second line. The first memory chip is coupled to the second node via a first branch bus and the second memory chip is coupled to the third node via a second branch bus. Accordingly, reflected wave due to an impedance mismatching can be reduced to enhance the signal integrity.

12 Claims, 11 Drawing Sheets

FIG. 1
(CONENTIONAL ART)

MEMORY SYSTEM INCLUDING A POWER DIVIDER ON A MULTI MODULE MEMORY BUS

CROSS-REFERENCE TO RELATED APPLICATIONS

This application claims priority under 35 USC § 119 to Korean Patent Application No. 2006-10384, filed on Feb. 3, 2006, in the Korean Intellectual Property Office (KIPO), the disclosure of which is incorporated herein in its entirety by reference.

BACKGROUND

1. Field of the Invention

The present invention relates to a memory system, and more particularly to a memory system including a Wilkinson power divider on a multi-module memory bus architecture capable of enhancing the signal integrity along the bus architecture.

2. Description of the Related Art

As the operation frequency of a processor in a memory system increases toward the giga hertz (GHz) level, the performance of a main memory needs to be improved for matching the performance of the entire system.

One such method of improving the main memory includes using a memory system that adopts a multi-module memory bus architecture with increased bandwidth to improve the performance of the entire system. The multi-module memory bus architecture may be patterned on a printed-circuit board. The main memory in a computer system typically includes DRAM that coupled to a processor through a multi-bit interface as a system on chip (SoC).

Figure 1:
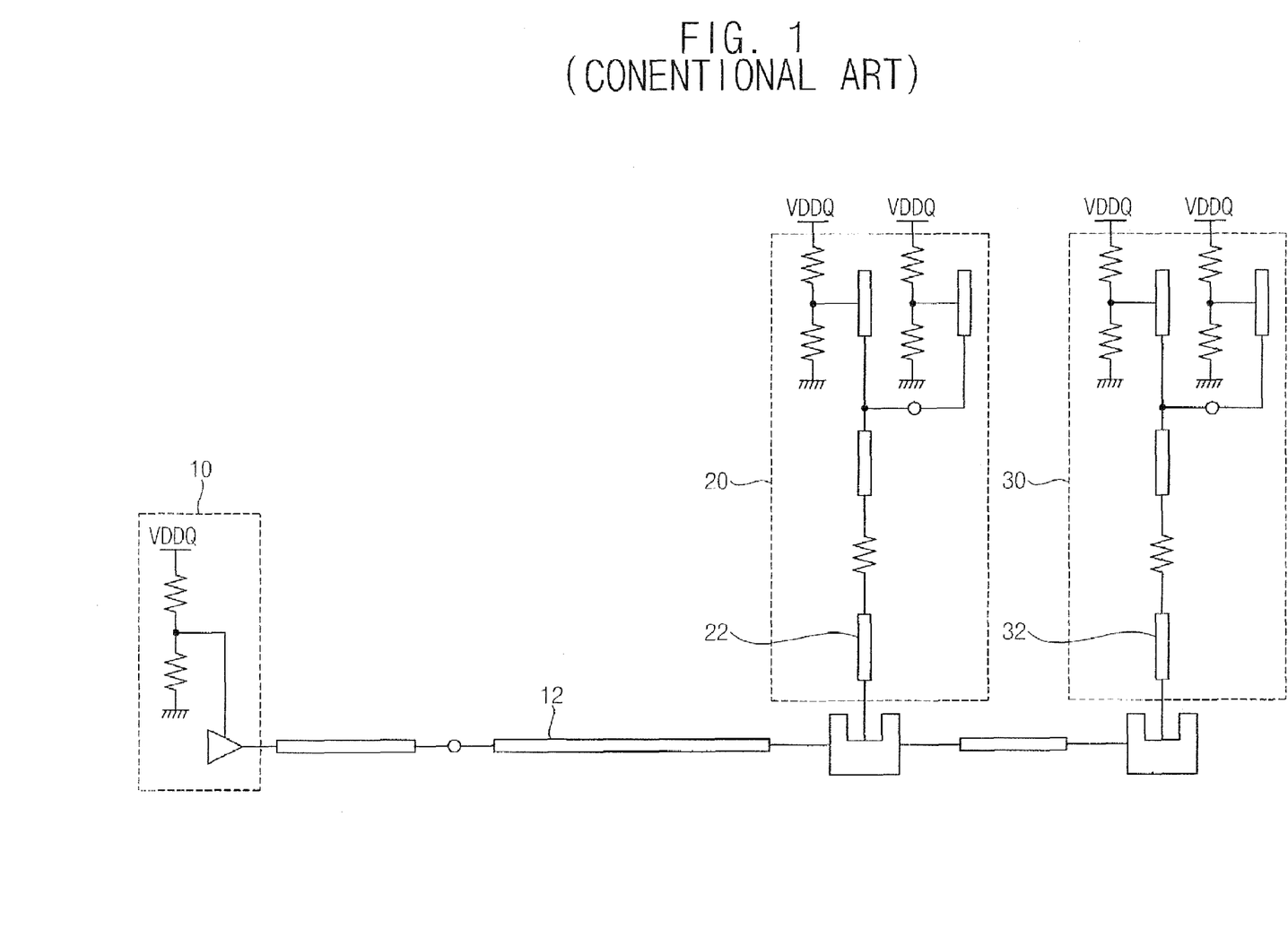
FIG. 1 is a diagram illustrating a conventional memory system including a multi-module memory bus architecture with On-Die Termination (ODT).

FIG. 1 is a diagram illustrating a conventional memory system including a multi-module memory bus architecture with On-Die Termination (ODT).

Referring to FIG. 1, a multi-module memory bus architecture has a configuration in which a plurality of memory modules 20 and 30 are coupled in common to a memory controller 10 via a transmission bus 12. In the memory bus architecture, the memory modules 20 and 30 are coupled to a memory controller 10 via two branch buses 22 and 32 branched from the main bus 12.

These branch connections for a one-to-two connection line configuration (that is, the stubs) are usually sources of impedance mismatching. The impedance mismatching causes inter-symbol interference, and thus limits the speed of high-speed digital systems. Therefore, a memory system having improved signal integrity is desirable.

SUMMARY

Accordingly, the present invention is provided to substantially obviate one or more problems due to limitations and disadvantages of the related art.

Some embodiments of the present invention provide a memory system having multi-module memory bus architecture capable of reducing or removing reflection problems in a transmission line using a Wilkinson power divider.

In some embodiments of the present invention, a memory system includes a memory controller, a transmission bus, a power divider, a first memory chip, and a second memory chip.

The transmission bus transfers signals, and a first end of the transmission bus is coupled to the memory controller. The power divider includes first, second, and third nodes, and the first node of the power divider is coupled to a second end of the transmission bus. The first memory chip is coupled to the second node via a first branch bus, and the second memory chip is coupled to the third node through a second branch bus.

DETAILED DESCRIPTION

Embodiments of the present invention will now be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
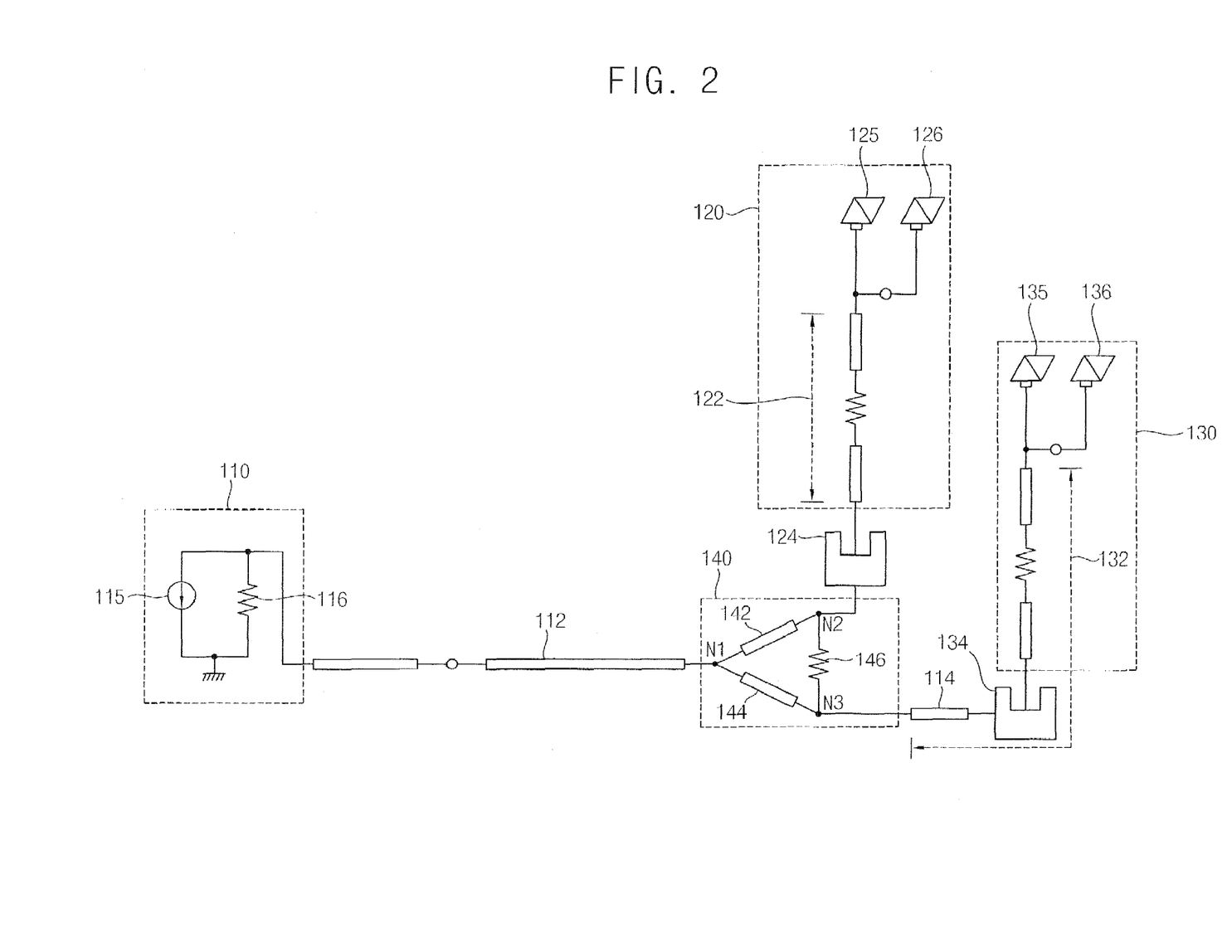
FIGS. 2 and 3 are block diagrams illustrating a memory system including a Wilkinson power divider on a multi module memory bus according to an embodiment of the present invention.
Figure 3:
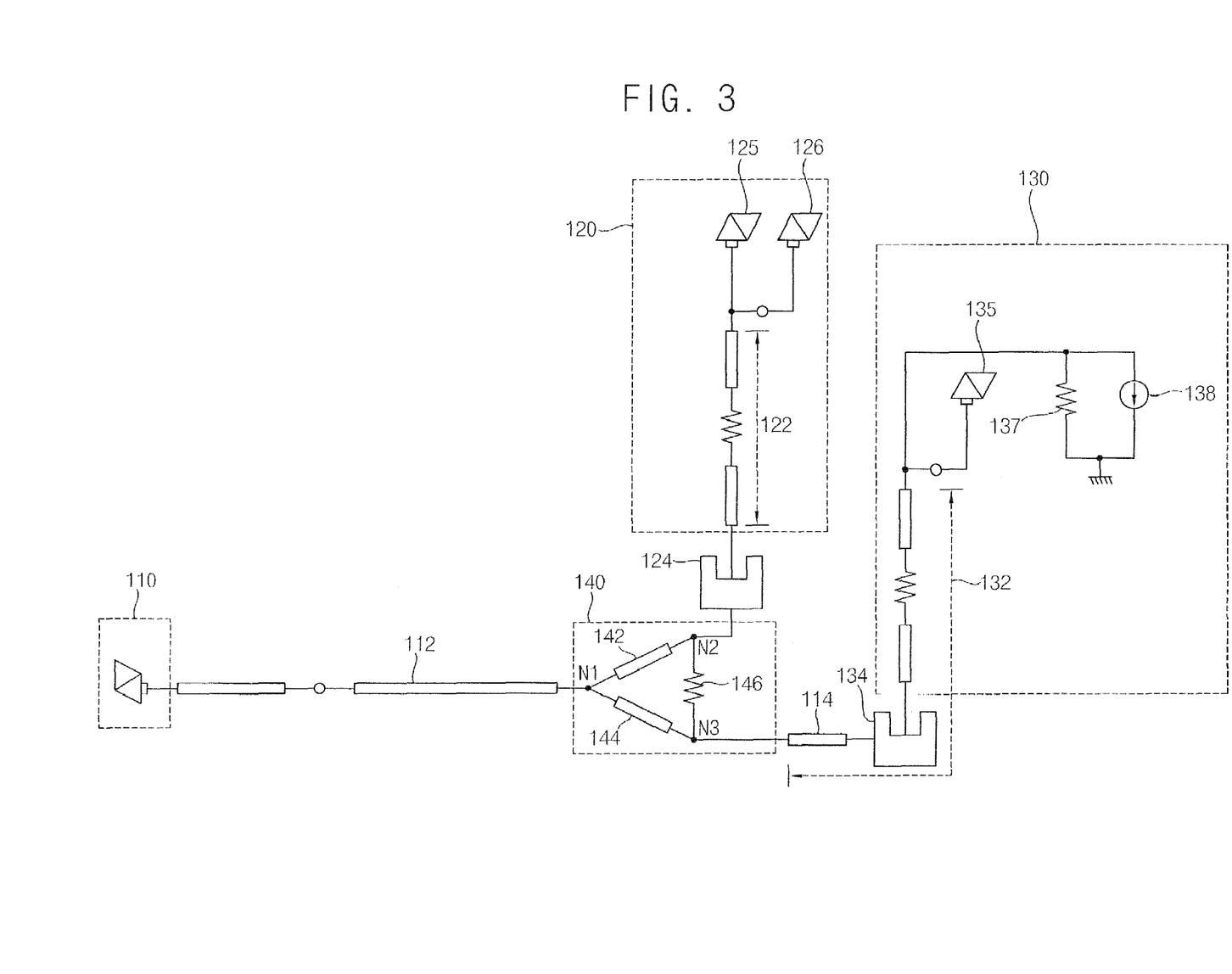

FIGS. 2 and 3 are block diagrams illustrating a memory system including a Wilkinson power divider on a multi module memory bus according to an embodiment of the present invention. FIG. 2 illustrates the memory system performing a write operation, and FIG. 3 illustrates the memory system performing a read operation.

Referring to FIGS. 2 and 3, the memory system includes first and second memory modules 120 and 130, first and second sockets 124 and 134, a power divider 140, a main bus 112 and a memory controller 110. The memory controller 110 is coupled to the power divider 140 via the main bus 112 and the power divider is coupled to the memory modules 120 and 130. The main bus 112 may be formed on a printed-circuit board (PCB, that is, a motherboard—not shown).

The memory controller 110 in FIG. 2 may be identical to the memory controller 110 in FIG. 3. The memory controller 110 may be represented as an equivalent circuit including a signal current source 115 and an output resistor 116 as shown in FIG. 2 since during a write operation, the memory controller 110 may transmit data to one of memory chips 125, 126, 135 and 136 in the first or second memory modules 120 and 130. On the other hand, each of the memory chips 125, 126, 135 and 136 may be represented as an equivalent circuit including a signal current source 138 and an output resistor 137 as shown in FIG. 3 (representing memory chip 136 shown in FIG. 2) since during a read operation, the selected memory chip 125, 126, 135, and 136 transmits data to the memory controller 110. The memory chips 125, 126, 135, and 136 may correspond to master chips.

The first memory module 120 may be inserted into a first socket 124 (e.g., a connector) on the PCB and may be electrically coupled to the power divider 140. For example the first memory module 120 may correspond to dual in-line memory module (DIMM) and the first socket 124 may correspond to a DIMM socket. A first branch bus 122 (i.e., a stub) may be formed on the PCB of the DIMM, and may connect the first socket 124 with the memory chips 125 and 126 (for example, DDR or SDRAM). The length of the first branch bus 122 may be represented as Ls1 and the impedance of the first branch bus 122 may be represented as Zs1. Each terminal of the memory chips 125 and 126 may further be coupled to an ODT resistor and the value of the ODT resistor may vary depending on network topology.

The second memory module 130 may be inserted into a second socket 134 (e.g., a connector) and may be electrically coupled to the power divider 140. For example, the second memory module 130 may correspond to dual in-line memory module (DIMM) and the second socket 134 may correspond to a DIMM socket. A second branch bus 132 (i.e., a stub) may be formed on the PCB of the DIMM. The length of the second branch bus 132 may be represented as Ls2, which is a sum of a length from the second socket 134 to the terminals of the memory chips 135, 136 and a length of a wire line 114. The line impedance of the second branch bus 132 may indicate Zs2. Each terminal of the memory chips 135 and 136 may be coupled to an ODT resistor and the value of the ODT resistor may again vary depending on network topology.

The second socket 134 may be coupled to the power divider 140 via the wire line 114 formed on the PCB. As a result, the length of a path to the memory chips 135 and 136 may be longer than the length of a path to the memory chips 125 and 126 by the length of the wire line 114. In addition, there may be some differences between the length of the first branch bus 122 and the length of the second branch bus 132. Thus, length Ls1 may be different from length Ls2. Similarly, the impedance of the first branch bus 122 Zs1 may be different from the impedance of the second branch bus 132 Zs2. This, in turn, may result in an impedance mismatch between the first branch bus 122 and the second branch bus 132. The impedance mismatching may cause signal reflection and thus cause an unnecessary standing wave of a particular frequency on the signal path. The unnecessary standing wave may attenuate signal intensity at the particular frequency and may thus degrade signal integrity.

The power divider 140 includes a first line 142 formed between a first node N1 and a second node N2, a second line 144 formed between the first node N1 and a third node N3, and an absorption resistor 146 formed between the second and third nodes N2 and N3. The lengths of the first and second lines may be represented as Lw1 and Lw2, respectively, and the impedance of the first and second lines may be represented as Zw1 and Zw2, respectively. The impedance of the absorption resistor 146 may be represented as Rw that equals 2×Zs1.

The memory controller 110 may be a master chip such as an AMB (advanced memory buffer) chip.

The power divider may correspond to a Wilkinson power divider. Using a Wilkinson power divider, the problem of a reflection effect appearing in circuits coupled to each other may be resolved. The Wilkinson power divider includes a first line between the first and second nodes having a first length Lw1, a second line between the first and third nodes having a second length Lw2, and an absorption resistor coupled between the second and third nodes. A line impedance of the first and second lines Zw and a resistance of the absorption resistor Rw satisfy following Equations 1 and 2.

$$Zw = \sqrt{(2 \times Zm \times Zs)}$$  [Equation 1]

where the Zm represents an impedance of the transmission bus and the Zs represents the stub impedance.

$$Rw = 2 \times Zs \quad \text{[Equation 2]}$$

The first length Lw1 and the second length Lw2 may be the same, and may be equal to one fourth of a transferred signal wavelength. Each length of the first and second branch buses 122, 132 (represented hereafter as Lb) may be actually equal to the first length Lw1. Primarily each port of the Wilkinson power divider should be matched to the characteristic impedance of the transmission bus, but in the structure of the actual memory system it may be difficult to be completely matched because of termination resistance and parasitic elements such as parasitic capacitance, parasitic inductance, and the like. Strong reflection occurs at the frequency where the length of branch Lb is a quarter-wave length. That is, when the length of the Wilkinson power divider Lw is the same as the length of branch Lb such that both lengths Lb, Lw have a quarter-wavelength length, a strong reflection occurs. In this case, the length of the branch Lb may be the same as the length of the first line 142. However, if a wire line 114 (shown in FIG. 2) is coupled to the second branch line between the second node N2 and the second connector 134 so that the structures of the first and second branch lines 122 and 132 in FIG. 2 and FIG. 3 are same, the next stages of the Wilkinson power divider may have the same structure as each other. Accordingly, if the length of the Wilkinson power divider Lw is set equal to length of the next stage of the Wilkinson power divider (that is, Ls+L114), an improved result may be obtained. Thus, using the Wilkinson power divider may reduce signal interference without the use of a stub resistor in a memory module because of the decrease in the reflection between the first and second branches.

The first and second lines may consist of micro strip line and strip line on a glass epoxy (FR4) board.

Here, the memory module includes all the modules connected by multi-stub type modules, such as DDR2-SDRAM memory modules and DDR3-SDRAM memory modules.

The memory module of the present invention may include a module board, a data input/output (I/O) terminal, a transmission bus in which one end is connected to the data I/O terminal, a power divider having a first node coupled to another end of the transmission bus, a second node and a third node, a first memory chip coupled to the second node via a first branch bus, and a second memory chip coupled to the third node via a second branch bus.

The first and second branch may consist of only a wire without mounting a stub resistor. That is, the stub resistor established in the line of a module can be eliminated since reflection conditions are addressed by the power divider.

Figure 4:
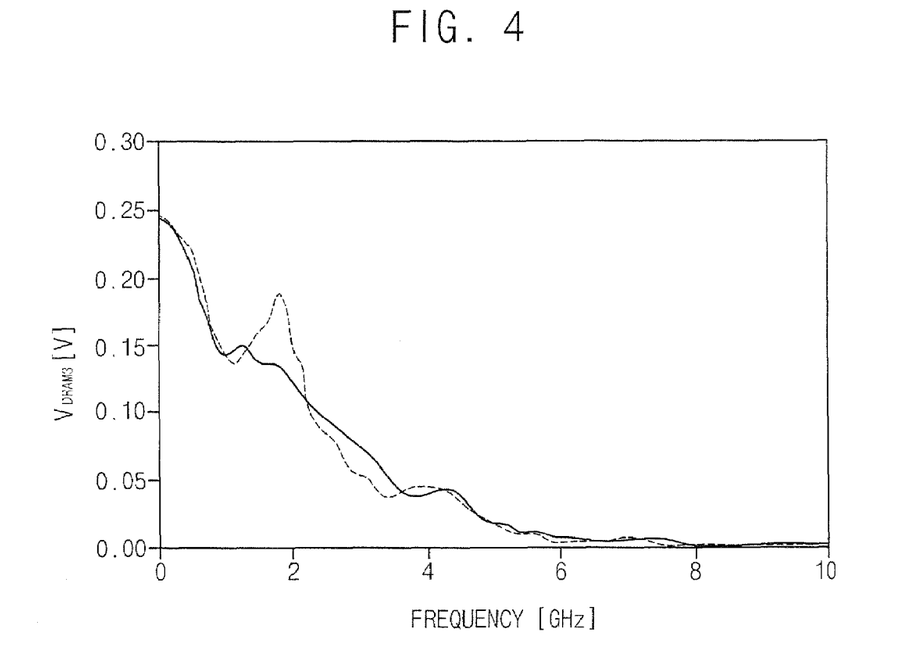
FIG. 4 is a graph illustrating an improved AC response in a write operation of the memory system shown in FIG. 2.

FIG. 4 is a graph illustrating an improved AC response in a write operation of the memory system shown in FIG. 2.

FIG. 4 illustrates a voltage-frequency characteristic when a memory controller 110 writes data to the memory chip in the memory module 130. The dotted line shows an AC response of a conventional memory device without a power divider and the solid line shows an AC response of a memory device including a power divider according to the present invention. The lines illustrate the AC response when Lw corresponds to 21.4 mm, Ls1 corresponds to 23 mm, Ls2 corresponds to 39 mm, resistance of an output resistor corresponds to 35 ohm, Rw corresponds to 120 ohm, and Zw corresponds to 60 ohm at an operation frequency of 2 GHz.

As shown in FIG. 4, the memory device including the power divider has a better performance characteristic than that of the conventional memory device at about 2 GHz during a write operation. In particular, the dotted line shows an abnormally high voltage at about 2 GHz due to reflected wave at about 2 GHz. On the other hand, the solid line corresponding to the memory device including the Wilkinson power divider shows a voltage that is significantly reduced from that of the conventional memory device.

Figure 5:
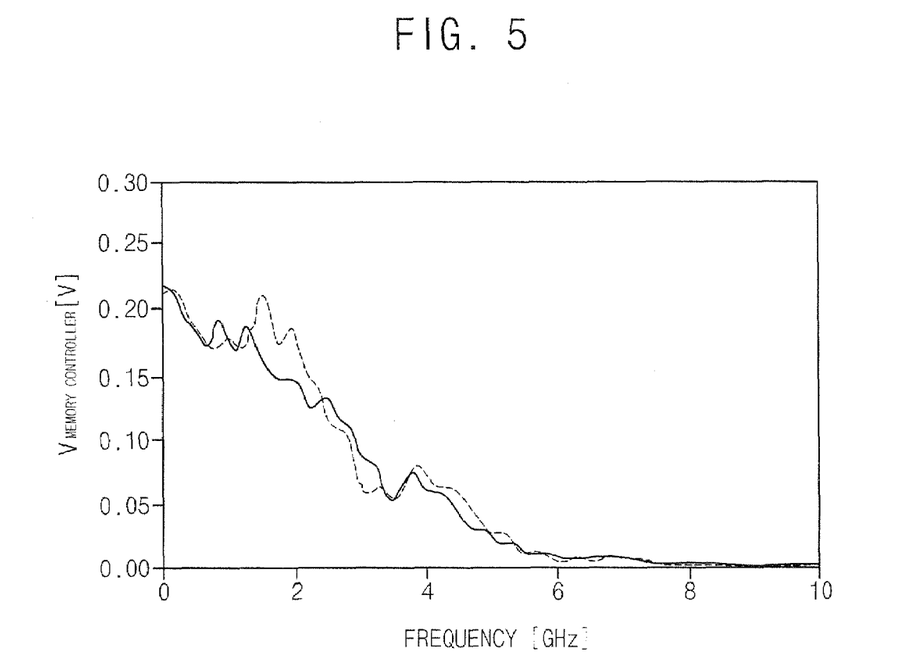
FIG. 5 is a graph illustrating an improved AC response in a read operation of the memory system shown in FIG. 3.

FIG. 5 is a graph illustrating an improved AC response in a read operation of the memory system shown in FIG. 3.

FIG. 5 illustrates a voltage-frequency characteristic when a memory controller 110 reads data from the memory chip in the memory module 130. The dotted line shows an AC response of a conventional memory device without a power divider and the solid line shows an AC response of a memory device including a power divider according to the present invention.

As shown in FIG. 5, the memory device including the power divider has a better performance characteristic than that of the conventional memory device at about 2 GHz during a read operation similarly to the write operation shown in FIG. 4. The dotted line again shows an abnormally high voltage due to reflected waves at about 2 GHz. The solid line corresponding to the memory device including the Wilkinson power divider, however, again shows a significant reduction in the voltage as compared to the conventional memory device.

These results may be confirmed also in timing diagrams that show an abnormality in the DC voltage component (that is, where a constant voltage level is maintained) due to the reflected waves in the conventional memory system. Again, this voltage is significantly reduced in the memory system including a power divider. Further, when the power divider is included in the memory system such that an abnormal voltage is eliminated, the waveform of a received signal and the vertical magnitude of an eye diagram are considerably improved in a write operation at 6 Gbps and a read operation at 8 Gbps. These advantages can be seen by comparing the eye diagrams illustrated in FIGS. 6-13.

Figure 6:
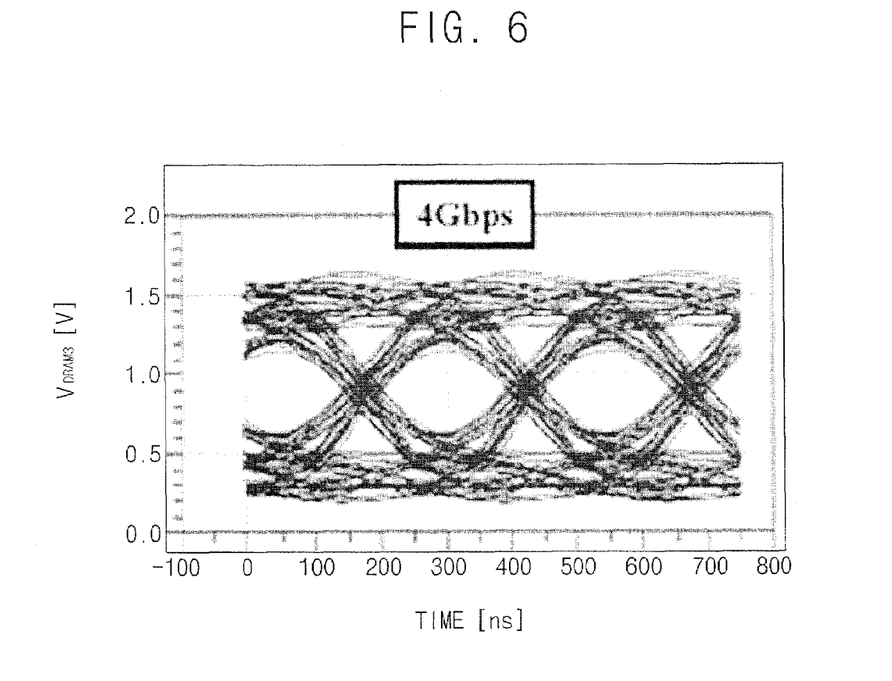
FIG. 6 is an eye diagram illustrating an eye pattern of a memory chip in the memory module for conventional memory devices without a power divider.
Figure 7:
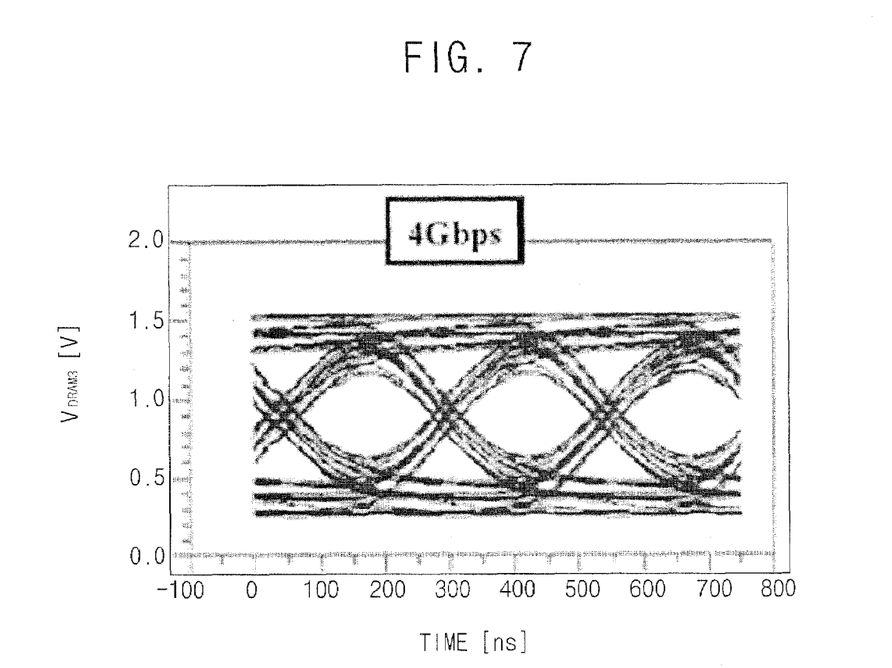
FIG. 7 is an eye diagram for embodiments including a power divider in a write operation at 4 Gbps.
Figure 8:
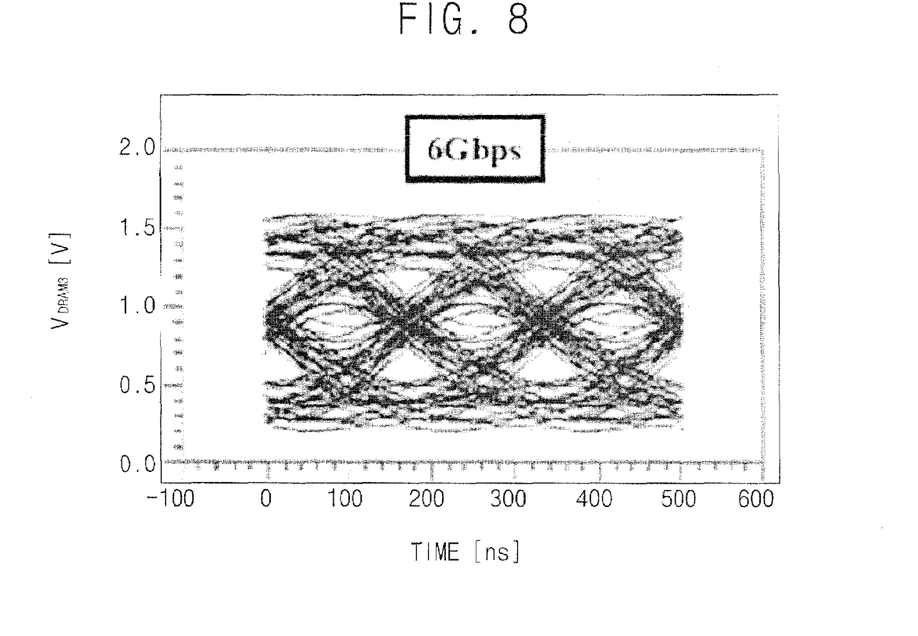
FIG. 8 is an eye diagram illustrating an eye pattern of a memory chip in the memory module 130 for conventional memory devices without a power divider.
Figure 9:
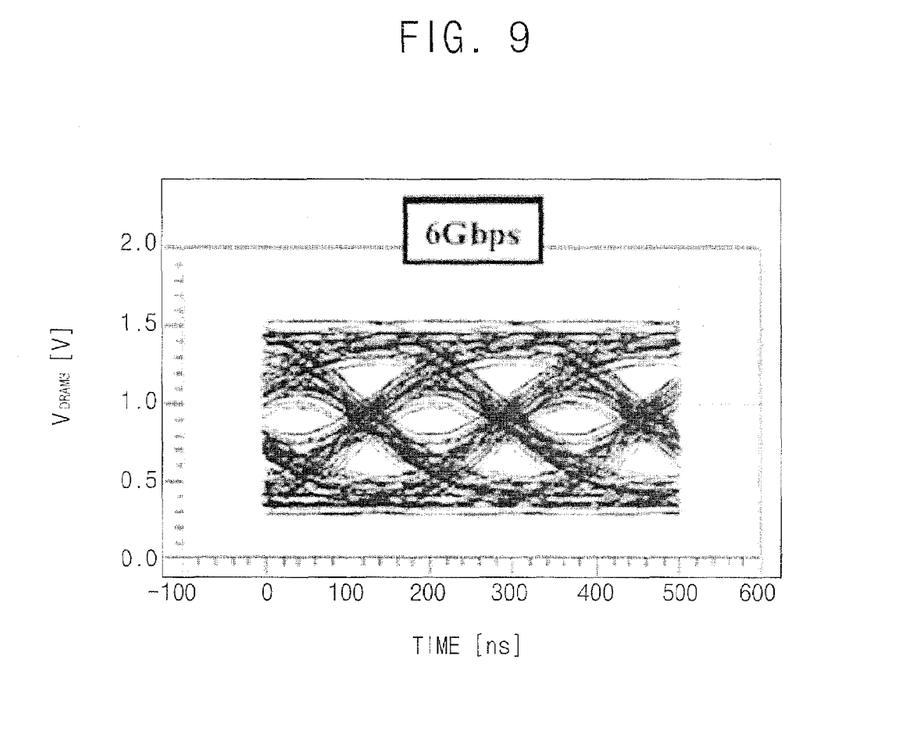
FIG. 9 is an eye diagram for embodiments including a power divider in a write operation at 6 Gbps.

FIG. 6 is an eye diagram illustrating an eye pattern of a memory chip in the memory module 130 for conventional memory devices without a power divider and FIG. 7 is an eye diagram for embodiments including a power divider in a write operation at 4 Gbps. FIG. 8 is an eye diagram illustrating an eye pattern of a memory chip in the memory module 130 for conventional memory devices without a power divider and FIG. 9 is an eye diagram for embodiments including a power divider in a write operation at 6 Gbps.

FIGS. 6 through 9 show that a transmission bus using a power divider significantly improves a signal waveform specification during a write operation over conventional memory systems.

Figure 10:
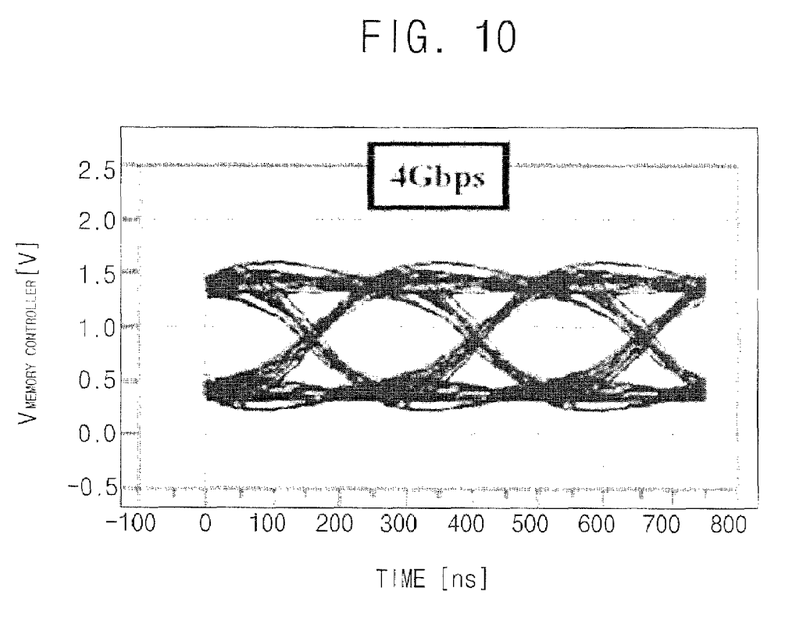
FIG. 10 is an eye diagram illustrating an eye pattern of a memory controller chip for conventional memory devices without a power divider.
Figure 11:
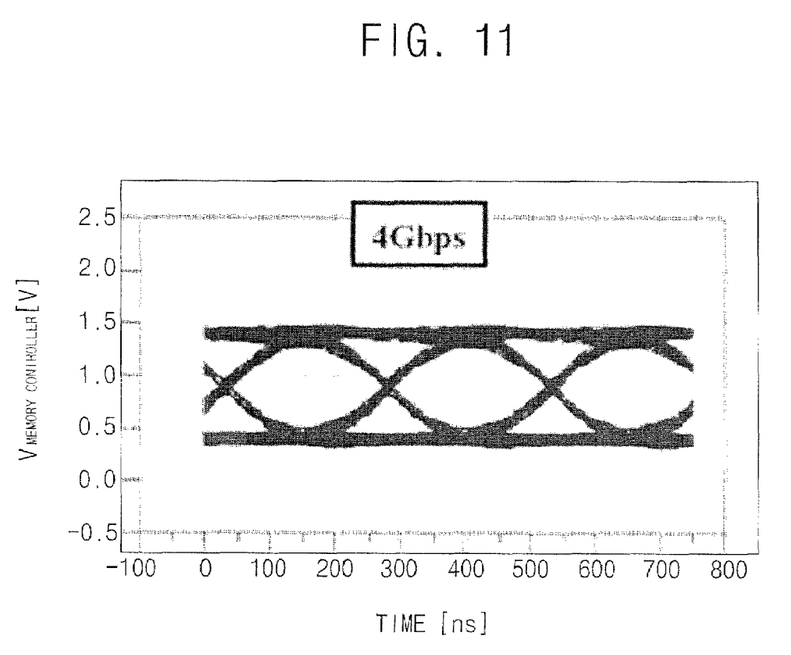
FIG. 11 is an eye diagram for embodiments including a power divider in a read operation at 4 Gbps.
Figure 12:
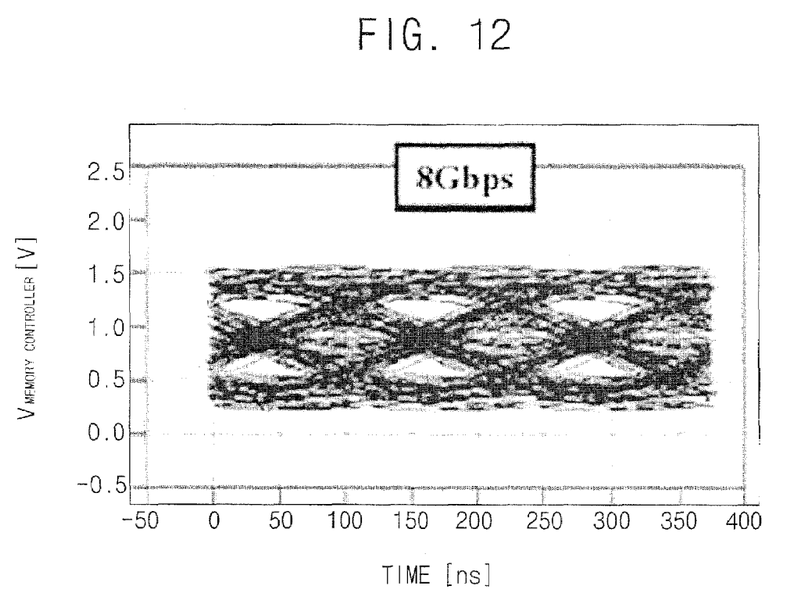
FIG. 12 is an eye diagram illustrating an eye pattern of a memory controller chip for conventional memory devices without a power divider.
Figure 13:
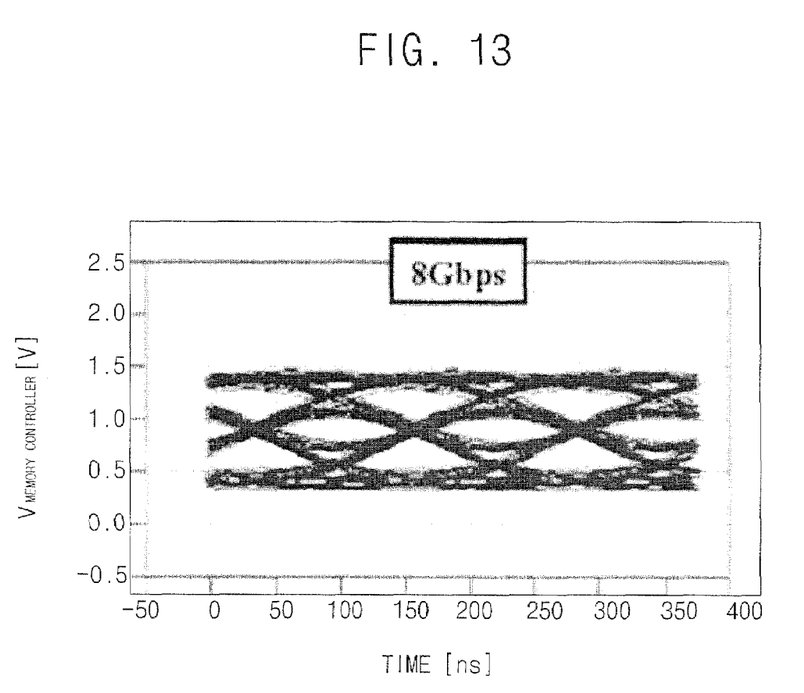
FIG. 13 is an eye diagram for embodiments including a power divider in a read operation at 6 Gbps.

FIG. 10 is an eye diagram illustrating an eye pattern of a memory controller chip 110 for conventional memory devices without a power divider and FIG. 11 is an eye diagram for embodiments including a power divider in a read operation at 4 Gbps. FIG. 12 is an eye diagram illustrating an eye pattern of a memory controller chip 110 for conventional memory devices without a power divider and FIG. 13 is an eye diagram for embodiments including a power divider in a read operation at 6 Gbps.

FIGS. 10 through 13 show that a transmission bus using a power divider significantly improves a signal waveform specification during a read operation over conventional memory systems. These figures (FIG. 6-13) show that the abnormalities due to the signal reflection in the conventional memory systems may be significantly improved in embodiments of the present invention which include a power divider. Thus, when a power divider is included in the memory system, abnormally high voltages can be eliminated to improve the waveform of a received signal and a vertical magnitude of an eye diagram may be considerably improved during write operations at 6 Gbps and during read operations at 8 Gbps.

Figure 14:
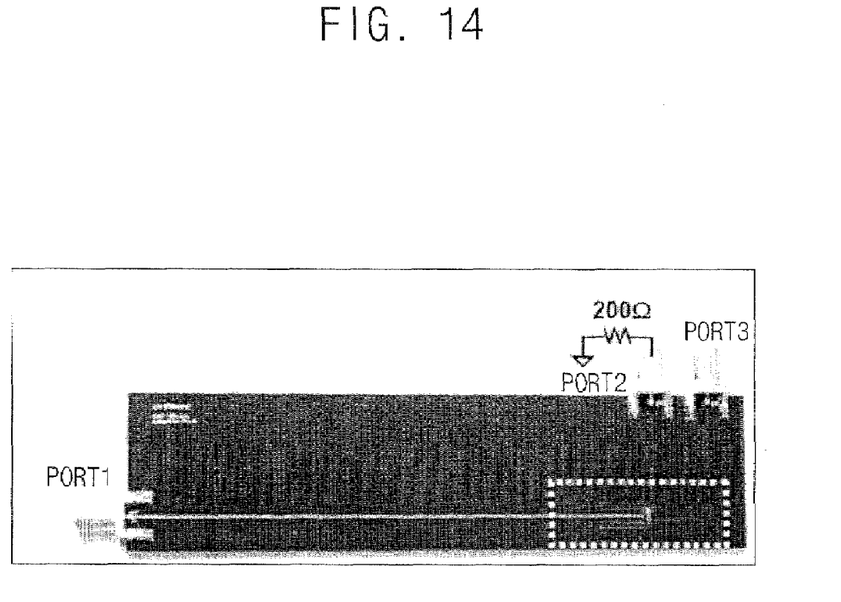
FIG. 14 is a picture of a test board for testing a multi-module memory bus architecture including a power divider according to an embodiment of the present invention.
Figure 15:
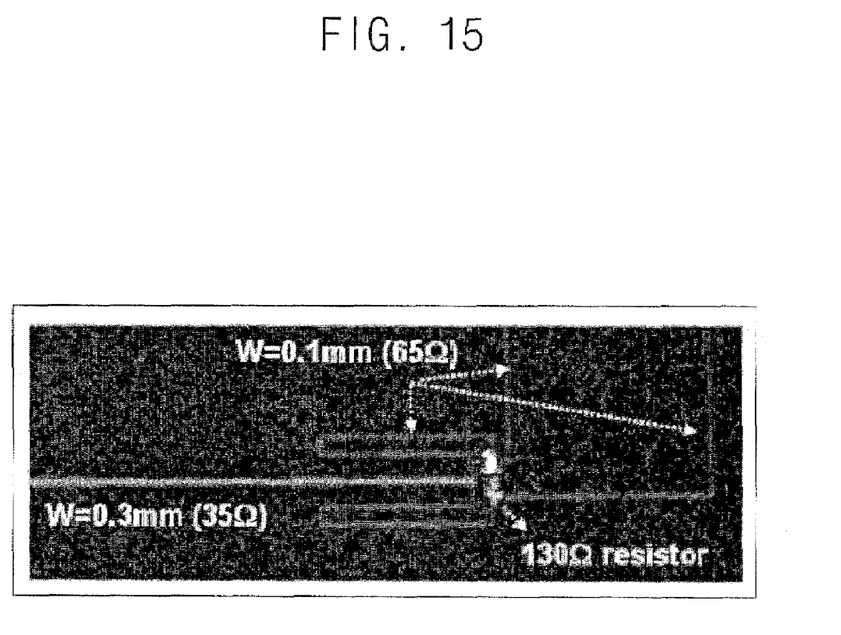
FIG. 15 is an extended picture of a dotted area shown in FIG. 14.

FIG. 14 is a picture of a test board for testing a multi-module memory bus architecture including a power divider according to an embodiment of the present invention and FIG. 15 is an extended picture of a dotted area shown in FIG. 14.

Referring to FIG. 14, the test board corresponds to a glass epoxy substrate with dimensions of about 126 mm by about 32 mm. A main bus corresponds to a copper wire with a thickness of about 3 mm formed between a first port and a first node on the glass epoxy (FR4) substrate to correspond to an impedance of 35 ohms. A first line in a power divider may correspond to a microstrip line that is formed by a copper wire with a thickness of about 0.1 mm between the first node and a second node to correspond to a line impedance of about 65 ohms. A second line in the power divider may correspond to a microstrip line that is formed by a copper wire with a thickness of about 0.1 mm between the first node and a third node to correspond to a line impedance of about 65 ohms. An absorption resistor of about 130 ohms is mounted between the second and third nodes. A copper wire with a thickness of about 0.1 mm is arranged between the second node and a second port to correspond to a line impedance of about 65 ohms. The second port is coupled to a termination resistor of about 200 ohms. A copper wire with a thickness of about 0.1 mm is arranged between the third node and a third port to correspond to a line impedance of about 65 ohms. A signal reflection is measured at the third port by applying signals to the first port and receiving the signals at the second port. The experimental setup is describes as follows: The impedance of the termination in a chip set is increased to 50 ohms and is coupled to an SMA connector for applying signals. The third port, where signal reflection is measured, is coupled to an SMA connector and the SMA connector is coupled to an oscilloscope. The second port, which influences the reflected wave, is also coupled to an SMA connector where the SMA connector is further coupled to a reverse polarity SMA connector on which a 200 ohm resistor is mounted.

Figure 16:
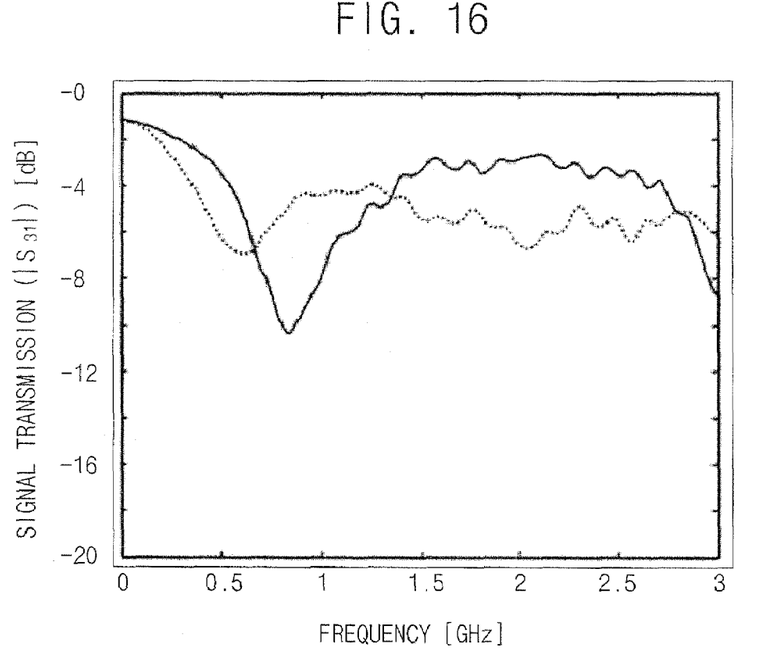
FIG. 16 is a diagram illustrating a measured s-parameter of a signal applied to a test board in relation to the frequency.

FIG. 16 is a diagram illustrating a measured s-parameter of a signal applied to a test board in relation to the frequency. Referring to FIG. 16, the dotted line represents a memory device which includes a power divider and the solid line represents a memory device without a power divider. As shown in FIG. 15, the memory device that includes the power divider shows a reduced resonance dip at about 1 GHz as compared to the memory device that lacks the power divider. Although in both cases a resonance frequency may be changed because of an electrical delay in the socket, the magnitude of the resonance dip due to reflected waved can be significantly reduced in embodiments of the present invention.

Figure 17:
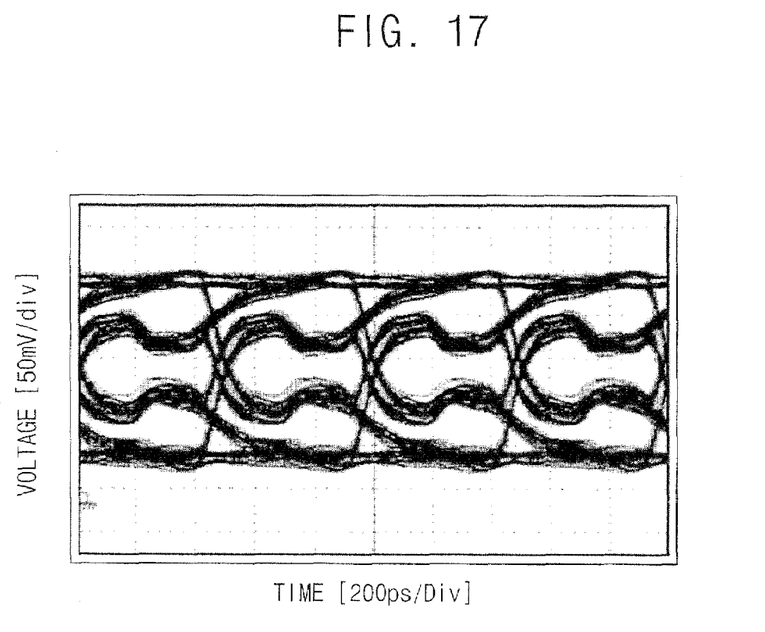
FIG. 17 is a diagram illustrating a waveform for conventional memory devices without a Wilkinson power divider.
Figure 18:
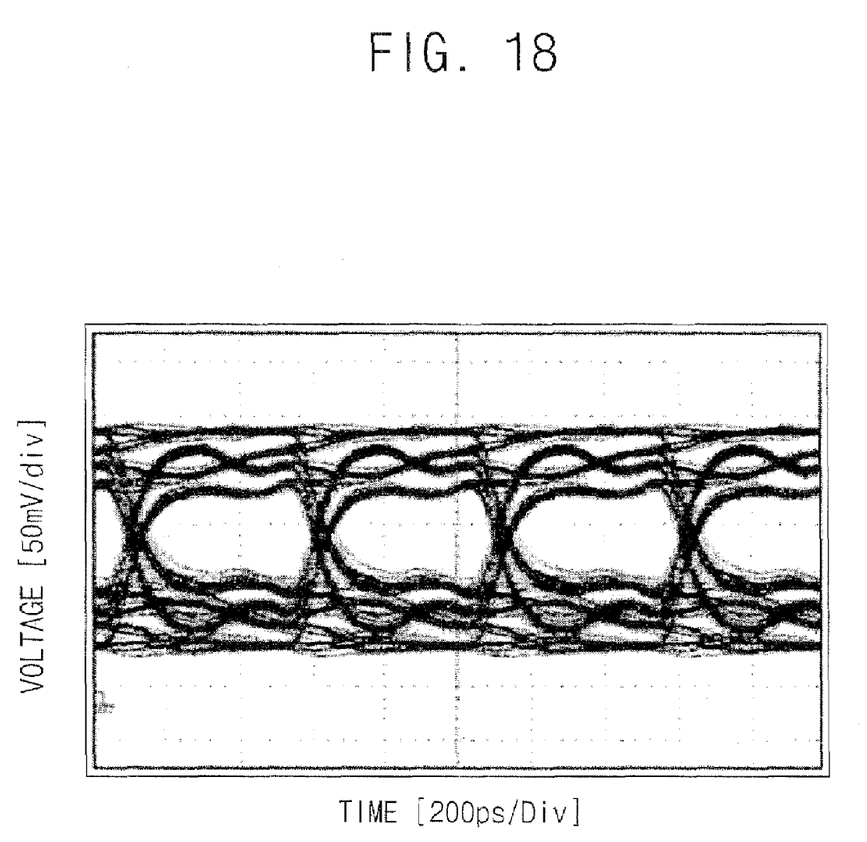
FIG. 18 is a diagram illustrating a waveform of an output signal at a third port for embodiments including a Wilkinson power divider, such as those shown in FIG. 15.

FIG. 17 is a diagram illustrating a waveform for conventional memory devices without a Wilkinson power divider, while FIG. 18 is a diagram illustrating a waveform of an output signal at a third port for embodiments including a Wilkinson power divider, such as those shown in FIG. 15. To measure an eye pattern in time domain for FIGS. 17 and 18, a 2 Gbps pseudo random bit sequence (PRBS) can be applied to port 1 and the output signal can be measured at port 3 using an oscilloscope. As shown in FIGS. 17 and 18, the reflected wave can again be considerably reduced in embodiments of the present invention as compared to those of conventional devices. This may further verify that the problems associated with reflected waves in memory devices may be noticeably mitigated according to embodiments of the present inventions both in the time and frequency domains not only by simulation but also by experiment. Additionally, in an actual memory system, a stub length may be determined by determining actual parasitic components and the length of the transmission line within a package for accurate impedance matching.

As mentioned above, in the memory system according to the present invention, the reflected wave due to an impedance mismatching may be reduced, thereby enhancing the signal integrity in a transmission line by including a Wilkinson power divider at a branch point on a multi-module memory bus.

While the example embodiments of the present invention and their advantages have been described in detail, it should be understood that various changes, substitutions, and alterations may be made herein without departing from the scope of the invention.

What is claimed is:

1. A memory system comprising:
   a memory controller;
   a transmission bus configured to transfer signals, wherein a first end of the transmission bus is coupled to the memory controller;
   a power divider having first, second, and third nodes, the first node of the power divider being coupled to a second end of the transmission bus;
   a first memory chip coupled to the second node via a first branch bus; and
   a second memory chip coupled to the third node through a second branch bus,
   wherein the power divider comprises:
   a first line between the first and second nodes having a first length, and
   a second line between the first and third nodes having a second length, where the first line length is substantially equal to the second line length and substantially equal to each line length of the first and second branch buses.

2. The memory system of claim 1, wherein the power divider further comprises
   an absorption resistor coupled between the second and third nodes.

3. The memory system of claim 2, wherein each of the first length and the second length corresponds to one fourth of a wavelength of a transferred signal.

4. The memory system of claim 2, wherein the power divider is a Wilkinson power divider.

5. The memory system of claim 1, wherein the first and second lines include a micro strip line and a strip line, respectively.

6. The memory system of claim 1, wherein the first and second memory chips correspond to master chips.

7. The memory system of claim 1, wherein the first and second branch buses includes only a wire line without mounting a stub resistor.

8. A memory system comprising
   a module board;
   a data input/output(I/O) terminal;
   a transmission bus formed on the module board for transferring signals, wherein one end of the transmission bus is coupled to the I/O terminal;
   a power divider formed on the module board having first, second, and third nodes, the first node of the power divider being coupled to another end of the transmission bus;
   a first memory chip coupled to the second node via a first branch bus and mounted on the module board; and a second memory chip connected to the third node via a second branch bus and mounted on the module board, wherein the power divider comprises:
  a first line between the first and second nodes having a first length, and
  a second line between the first and third nodes having a second length, where the first line length is substantially equal to the second line length and substantially equal to each line length of the first and second branch buses.

9. A memory system comprising:
a memory controller;
a power divider including a first, second, and third node, where the first node is connected to the second node via a first line having a first line length, the first node is connected to the second node via a second line having a second line length, and the second node is connected to the third node via a line including an absorption resistor;
a transmission bus coupled between the memory controller and the first node of the power divider, the transmission bus structured to transfer a signal having a characteristic wavelength between the memory controller and the power divider;
a first memory module coupled to the second node of the power divider via a first socket, the first memory module including a first memory chip and a first branch bus having a first branch length connecting the first memory chip to the first socket; and
a second memory module coupled to the third node of the power divider via a second socket and a wire line having a third line length, the second memory module including a second memory chip and a second branch bus having a second branch length connecting the second memory chip to the second socket,
wherein the first line length is substantially equal to the second line length, the first branch length, and the sum of the third line length and the second branch length.

10. The memory system of claim 9, wherein the first line length is structured to be substantially equal to one fourth of the characteristic wavelength of the signal transferred over the transmission bus.

11. The memory system of claim 10, wherein the first and second branch bus do not include stub resistors.

12. A method of enhancing signal integrity on a multi module memory bus, the method comprising:
  transmitting a signal having a characteristic wavelength from a memory controller;
  receiving the transmitted signal at a first node of a power divider;
  directing the signal over a first line connecting the first node of the power divider to a second node of the power divider and substantially simultaneously directing the signal over a second line connecting the first node of the power divider to a third node of the power divider, where each of the first and second lines have a length substantially equal to one fourth of the characteristic wavelength;
  directing the signal at the second node to a first memory chip on a first memory module via a first branch bus having a length substantially equal to one fourth of the characteristic wave length; and
  directing the signal at the third node to a second memory chip on a second memory module via a third line and a second branch bus, where a sum of lengths of the third line and second branch bus is substantially equal to one fourth of the characteristic wave length.

* * * * *